(12) United States Patent
Stachura et al.

(10) Patent No.: US 6,292,038 B1
(45) Date of Patent: *Sep. 18, 2001

(54) SMOOTH CLOCK SWITCHING FOR POWER MANAGED PCI ADAPTERS

(75) Inventors: Thomas L. Stachura, Portland; David L. Chalupsky, Banks, both of OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,003

(22) Filed: Dec. 23, 1998

(51) Int. Cl.$^7$ .............................. H03K 5/13; H03L 7/00
(52) U.S. Cl. .............................. 327/145; 327/144; 327/99
(58) Field of Search .............................. 327/99, 34, 551, 327/311, 544, 144, 145; 395/750.04

(56) References Cited

U.S. PATENT DOCUMENTS

| | | | |
|---|---|---|---|
| 4,821,229 | * 4/1989 | Jauregui | 327/99 |
| 4,970,405 | * 11/1990 | Hagiwara | 327/99 |
| 5,099,141 | * 3/1992 | Utsunomiya | 327/99 |
| 5,768,602 | * 6/1998 | Dhuey | 395/750.04 |

FOREIGN PATENT DOCUMENTS

JP401044114A * 2/1989 (JP) .............................. 327/99

* cited by examiner

*Primary Examiner*—Dinh T. Le
(74) *Attorney, Agent, or Firm*—Blakely, Sokoloff, Taylor & Zafman LLP

(57) ABSTRACT

The present invention includes a method and apparatus for smooth transitions (switching) between asynchronous clocks without the occurrence of glitches. In one embodiment the present invention is used when powering up and powering down a computer system and transitioning between a relatively faster primary clock and a slower alternate clock. In another embodiment the present invention is used for transitioning between a relatively faster primary clock to a slower alternate clock to conserve power, for example, when a laptop transitions between use mode and sleep mode.

17 Claims, 4 Drawing Sheets

SMOOTH CLOCK SWITCHING FOR POWER MANAGED PCI ADAPTERS

BACKGROUND OF THE INVENTION

1. Field of the Invention

The present invention relates to the field of semiconductor devices and more specifically to smooth clock switching between asynchronous clocks.

2. Background Information

Clock switching has become a concern in various ways in the semiconductor industry due to the necessity of having many different clocks within a system to run (or time) the various devices within the system. For example, many computers today include devices that are run at high power voltages and devices that are run at low power voltages all in the same system. Devices that run at higher voltages may require faster clocks while devices that run at lower voltages may require slower clocks. Thus, the passing of information or data from one device to another may require clock transitions from faster clocks to slower clocks and vice versa all within the same system.

Another example is with the advent of portable computers (or laptop computers). With laptop computers there is a need for power conservation to extend battery life. In other words, when the laptop is not in use the power consumption is decreased by going into a sleep mode, thus saving the battery life. When the laptop enters power conservation (or sleep) mode the laptop switches from a relatively faster clock to a slower clock. When the laptop leaves the sleep mode to enter normal operation the laptop then switches from the slower clock to the faster clock.

Yet another consideration in computer systems is the idea of networking many computers together to run on the same system network. For example, when powering down a computer on a network the computer may look like it is "off" but really it has been powered down while the network is still running. This powering down of the computer requires the computer to switch from a relatively faster clock to a slower clock so that the computer appears to be off while the network remains running in the background. When the computer is then later powered up, the computer must switch from the slower clock back to the faster clock in order to run at a sufficient speed for the user.

Switching between different clocks and clock cycles becomes particularly problematic when the clocks are not synchronous to one another (i.e. asynchronous clocks). Switching between two asynchronous clocks may cause a "glitch" to occur and the device may enter a metastable state which in turn may cause system problems. For example, when switching from a relatively faster clock to a slower clock if the transition is performed at the time when the faster clock is on an upswing (i.e. transitioning high) and the slower clock is on a downswing (i.e. transitioning low) then the pulse (the transition from high to low) may be too fast to enter the system causing a glitch. It should be noted that glitches may occur under other circumstances and that the above example was given merely to be illustrative.

FIG. 1 illustrates an example of when (or how) a glitch may occur. In FIG. 1 there are two clocks running at the same time however the primary clock CLK A 110 is running relatively faster than the alternate CLK B 120. At the outset the system is running using CLK A 110. At some point, however, it becomes desirous to switch clocks to CLK B 120. Up until the switch is made Select A is high (SEL A 115) and Select B is low (SEL B 125), but at the switch SEL A 115 is driven low 116 and SEL B 125 is driven high 126. As illustrated in the resultant clock 150, the system runs using CLK A 110 and then after the switch the system runs using CLK B 120. Because the down swing 116 of CLK A 110 and the upswing 126 of CLK B 120 are so close in "time" the resultant clock exhibits a narrow pulse or "glitch" 180. Such a narrow pulse may be too fast to enter the system.

In the example of the networked computers a glitch may throw the microengine in an ethernet controller off causing the system to miss an instruction or skip an instruction. Therefore, switching between two asynchronous clocks cannot be blindly performed.

Thus, what is needed is a method and apparatus for switching between asynchronous clocks and performing this switch in a smooth transition without glitches.

SUMMARY OF THE INVENTION

The present invention provides a method and apparatus for switching between a first clock and a second clock wherein the first and second clocks are asynchronous to one another without exhibiting the problem of glitches.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A Method and Apparatus for Smooth Clock Switching for Power Managed PCI Adapters are disclosed. In the following description, numerous specific details are set forth such as specific materials, configurations, timing diagrams, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention includes a method and apparatus for smooth transitions (switching) between asynchronous clocks. In one embodiment the present invention is used when powering up and powering down a computer system and transitioning between a relatively faster primary clock and a slower alternate clock. In another embodiment the present invention is used for transitioning between a relatively faster primary clock to a slower alternate clock to conserve power, for example, when a laptop transitions between use mode and sleep mode.

Figure 1:
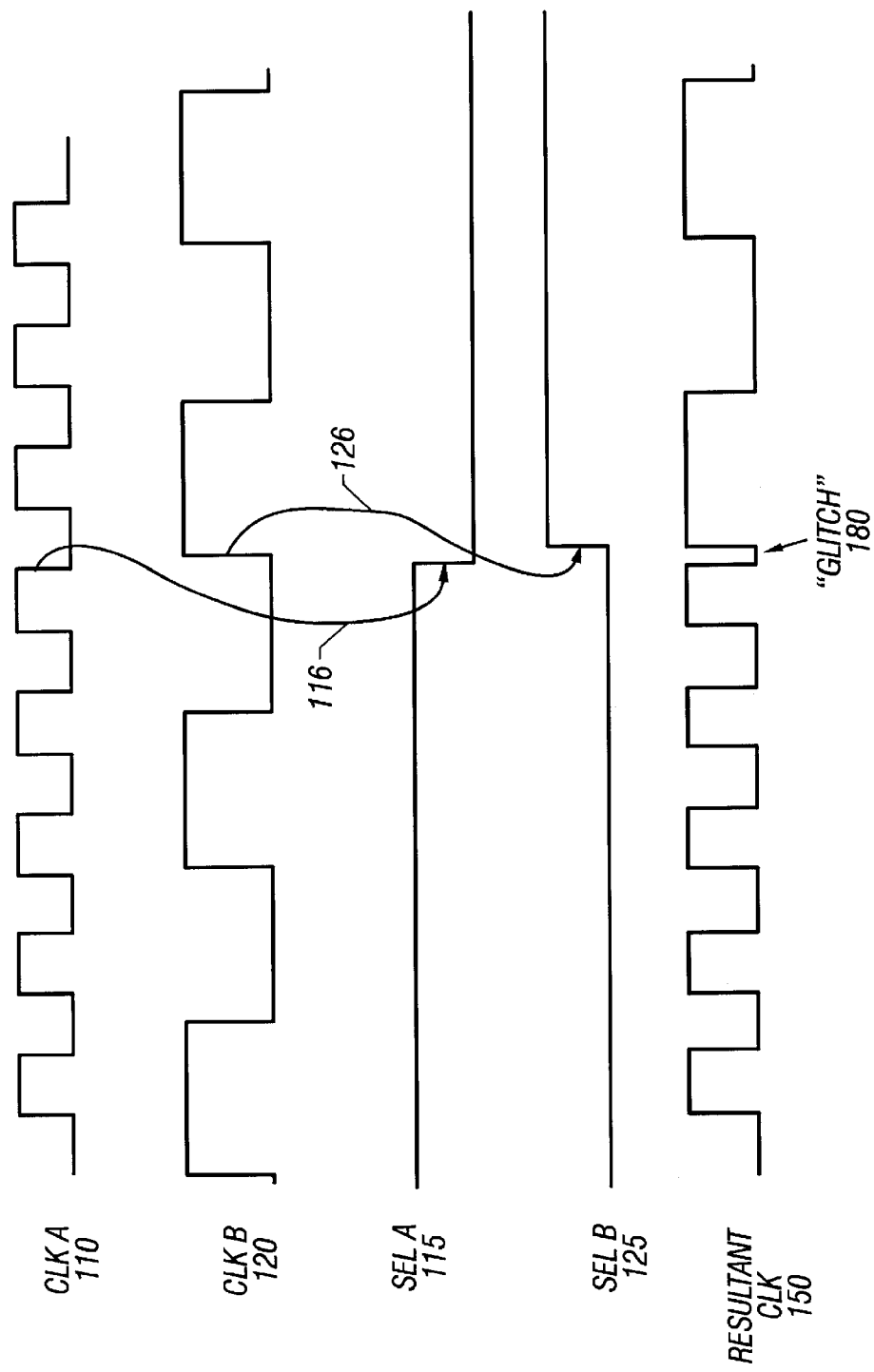
FIG. 1 illustrates an example of a clock sequence resulting in a glitch.
Figure 2:
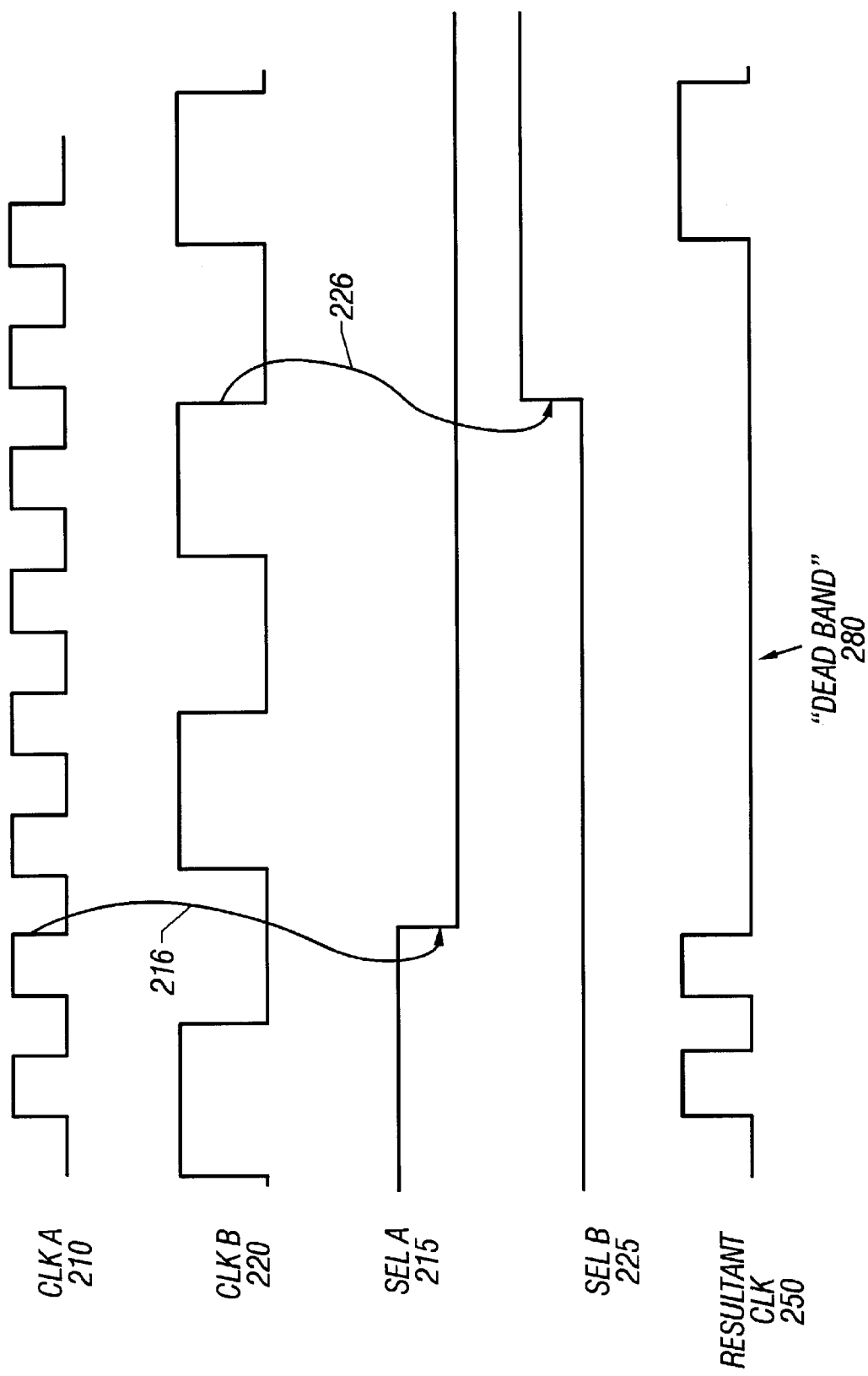
FIG. 2 illustrates an example of a timing sequence using an embodiment of the present invention.

FIG. 2 illustrates an example of the present invention and how the present invention may be used to avoid the problem of glitches when switching between two asynchronous clocks. In FIG. 2 there are two clocks running at the same time however primary clock CLK A 210 is running relatively faster than alternate CLK B 220. At the outset the system is running using CLK A 210. At some point, however, it becomes desirous to switch clocks to CLK B 220. It may be desirous to switch clocks, for example, when a laptop goes into a power conservation mode or when a computer system is being shutdown while the network is still running in the background. Up until the switch is made Select A is high (SEL A 215) and Select B is low (SEL B 225), but at the switch SEL A 215 is driven low 216. Then in order to avoid the potential of glitches (or narrow pulses) the system waits for 2 or 3 clock cycles before SEL B 225 is driven high 226.

As illustrated in FIG. 2, the resultant clock 250 of the system runs using CLK A 210, then the switch is begun by switching SEL A 215 from high to low 216. The system waits for two or three clock cycles and then SEL B 225 is switched from low to high 226. The period between switching SEL A 115 from high to low and switching SEL B 225 from low to high is referred to as the "Dead Band" 280 of Resultant CLK 250. During the Dead Band 280 nothing is driven on the Resultant CLK 250 until SEL B 225 goes high, at which time Resultant CLK 250 follows CLK B 220. Thus, Resultant CLK 250 has a smooth transition from CLK A 210 to CLK B 220.

Because the system waits two or three clock cycles before enabling the second clock narrow pulses or glitches are prevented from occurring. Although waiting for two to three clock cycles may slow the system down the amount of time actually lost is negligible compared to a glitch causing a metastable state thereby requiring the system to be restarted.

It should be noted that more than two or three clock cycles may be used, however it has been found that two to three clock cycles is sufficient to prevent the occurrence of glitches. It should also be noted that it is preferable to use two or more clock cycles rather than just one because of metastable conditions in common ASIC design. ASIC logic design requires that no changes in data occur during a window that includes the rising edge of a clock. Such times are commonly referred to as setup-time and hold-time. If either of the times are violated, the clocked storage element in the logic design may go into a metastable and cause downstream logic to see intermediate voltage levels, for example, intermediate voltage levels on the order of 2.5 volts may be seen in a system that otherwise operates at 0 volts for low and 5 volts for high. Thus, by using the present invention to delay the switching of the clocks the likelihood of violating the setup-time or hold-time is greatly reduced and thereby reduces the chances of metastability occurring in the part.

In an embodiment of the present invention a logic implementation is set up that couples between two modes, for example power up mode and power down mode or sleep mode and use mode, and enables the smooth transition between the two asynchronous clocks. Different logic implementations (and circuitry) may be set up depending upon if the configuration desired is a two clock cycle latency or a three clock cycle latency.

Figure 3:
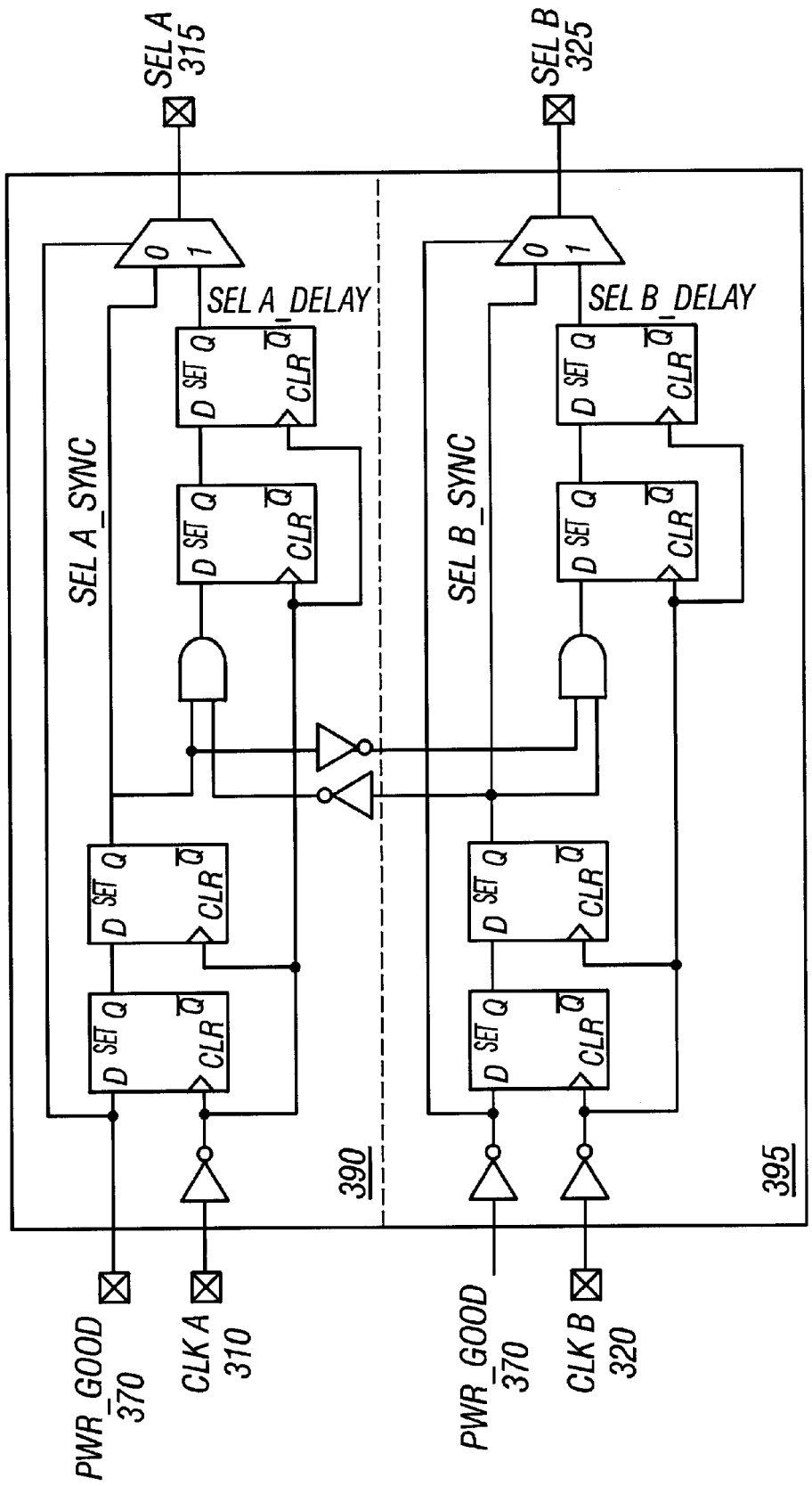
FIG. 3 illustrates the circuitry of one embodiment of a circuit used to practice the present invention.

FIG. 3 illustrates the circuitry of one embodiment of a logic implementation that may be used to practice the present invention. It should be noted that other configurations for the circuitry may also be designed and that the circuitry illustrated in FIG. 3 is meant merely to be illustrative and not limiting.

In the logic implementation example, illustrated in FIG. 3, there are two circuits, a primary circuit and an alternate (or secondary) circuit, each one running synchronously to the clock that it is controlling. In other words, there is primary circuit 390 controlling primary CLK A 310 and an alternate circuit 395 controlling alternate CLK B 320. Each circuit is made up of a combination of flip flops, AND gates, inverters, and multiplexers (MUX). Primary circuit 390 and alternate circuit 395 are coupled such that communication between the two circuits ensures that only one clock will be enabled at a time. In other words, if primary circuit 390 enables SEL A 315 then alternate circuit 395 will not enable SEL B 320 and the resultant clock (as described above) will follow CLK A 310. A control signal, PWR_GOOD 370, is used to tell both the primary circuit 390 and the alternate circuit 395 which one should be driving the system, but the coupling between the two circuits enables the circuits themselves to determine when one of the circuits is driving its respective clock and when the circuit stops driving its respective clock such that the transition between the clocks may be made smoothly.

Figure 4:
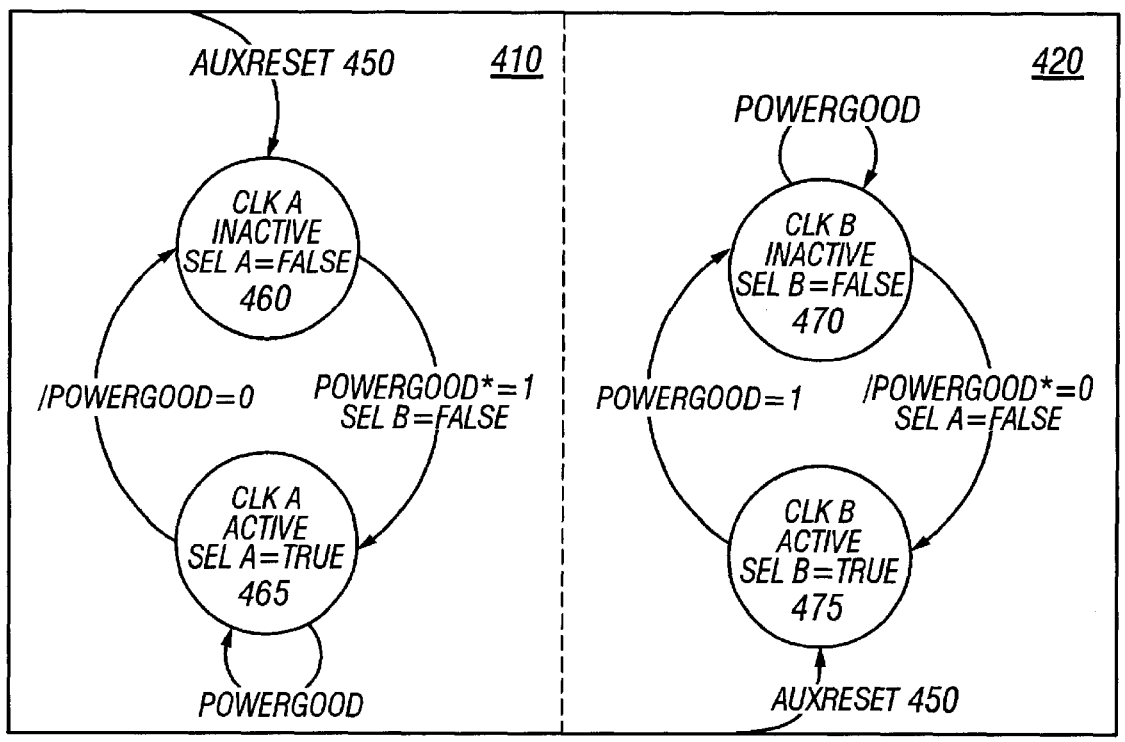
FIG. 4 illustrates state machine diagrams for a primary clock and an alternate clock in accordance with the present invention.

FIG. 4 illustrates state machine diagrams for a primary clock CLK A 410 and an alternate clock CLK B 420 in accordance with the present invention. State machine diagrams visually illustrate the relationship between CLK A 410 and CLK B 420 such that when one of the clocks is enabled the other clock is not enabled in accordance with the logic implementation illustrated in FIG. 3.

In one embodiment of the present invention a reset is used to place one of the circuits in active mode and the other in inactive mode. In the example illustrated in FIG. 4, AuxReset is used to place CLK A in inactive mode and CLK B in active mode. Referring again to the example illustrated in FIG. 4, CLK A 410 will go inactive if the control signal is zero (PowerGood=0) and CLK B 420 will go inactive if the control signal is one (PowerGood=1). Additionally, as illustrated in FIG. 4, CLK A 410 will go active if the control signal is one (PowerGood=1) and SEL B is False. Likewise, CLK B 420 will go active if the control signal is zero (PowerGood=0) and SEL A is False. Thus, the present invention enables smooth clock switching between asynchronous clocks without the occurrence of glitches.

It should be noted that the present invention may also be used when switching from the slower clock to the faster clock (i.e., changing from sleep mode to use mode or powering up a computer system) in a similar manner as that explained with regard to switching from the faster clock to the slower clock. It should also be noted that although the above description describes the clocks as being driven by the falling edge of the first clock, the present invention may be practiced using control logic that is driven by the falling or rising edge of the respective clocks.

Thus, a Method and Apparatus for Smooth Clock Switching for Power Managed PCI Adapters has been described. Although specific embodiments, including specific equipment, materials, configurations, timing diagrams, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. An apparatus comprising:
   a first circuit coupled to a first clock signal to provide a first select signal; and
   a second circuit coupled to a second clock signal and to the first circuit to provide a second select signal, wherein the first clock signal and the second clock signal are asynchronous to one another and the first select signal and the second select signal are provided to switch a resultant clock between the first clock signal and the second clock signal such that at least two cycles of the second clock signal elapse before the second clock signal is switched on after the first clock signal is switched off.

2. The apparatus as described in claim 1, wherein the first select signal and the second select signal are provided to switch the resultant clock between the first clock signal and the second clock signal such that two cycles of the second clock signal elapse before the second clock signal is switched on after the first clock signal is switched off.

3. The apparatus as described in claim 1, wherein the first select signal and the second select signal are provided to switch the resultant clock between the first clock signal and the second clock signal such that three cycles of the second clock signal elapse before the second clock signal is switched on after the first clock signal is switched off.

4. An apparatus comprising:
a first circuit coupled to a relatively fast clock signal to provide a first select signal;
a second circuit coupled to a slower clock signal and to the first circuit to provide a second select signal, wherein the relatively fast clock signal and the slower clock signal are asynchronous to one another and the first select signal and the second select signal are provided to switch a resultant clock between the relatively fast clock signal and the slower clock signal such that at least two cycles of the slower clock signal elapse before the slower clock signal is switched on after the relatively fast clock signal is switched off.

5. The apparatus as described in claim 4, wherein the first select signal and the second select signal are provided to switch the resultant clock between the relatively fast clock signal and the slower clock signal such that two cycles of the slower clock signal elapse before the slower clock signal is switched on after the relatively fast clock signal is switched off.

6. The apparatus as described in claim 4, wherein the first select signal and the second select signal are provided to switch the resultant clock between the relatively fast clock signal and the slower clock signal such that three cycles of the slower clock signal elapse before the slower clock signal is switched on after the relatively fast clock signal is switched off.

7. The apparatus as described in claim 4 wherein the apparatus transitions a computer between a sleep mode and a power up mode.

8. The apparatus as described in claim 4 wherein the apparatus transitions a computer on a networking system between an on state and an off state.

9. A computer system comprising:
a primary clock providing a primary clock signal to the computer system while the computer system is in a powered up state;
an alternate clock providing an alternate clock signal to the computer system while the system is in a powered down state, wherein the primary clock signal and the alternate clock signal are asynchronous to one another;
a primary circuit coupled to the primary clock signal to provide a first select signal, the primary circuit having a synchronizer, an AND gate, an inverter, and a multiplexer;
an alternate circuit coupled to the alternate clock signal to provide a second select signal, the alternate circuit having a synchronizer, an AND gate, an inverter, and a multiplexer, wherein the primary circuit and the alternate circuit are coupled to each other and the first select signal and the second select signal are provided to switch the computer system between the primary clock signal and the alternate clock signal such that at least two cycles of the alternate clock signal elapse before the alternate clock signal is switched on after the primary clock signal is switched off.

10. The computer system as described in claim 9, wherein the first select signal and the second select signal are provided to switch the computer system between the primary clock signal and the alternate clock signal such that two cycles of the alternate clock signal elapse before the alternate clock signal is switched on after the primary clock signal is switched off.

11. The computer system as described in claim 9, wherein the first select signal and the second select signal are provided to switch the computer system between the primary clock signal and the alternate clock signal such that three cycles of the alternate clock signal elapse before the alternate clock signal is switched on after the primary clock signal is switched off.

12. An apparatus comprising:
a first circuit coupled to a first clock signal to provide a first select signal, the first circuit including an inverter, a synchronizer, an AND gate, and a multiplexer;
a second circuit coupled to a second clock signal and to the first circuit to provide a second select signal, the second circuit including an inverter, a synchronizer, an AND gate, and a multiplexer;
wherein the first clock signal and the second clock signal are asynchronous to one another and the first select signal and the second select signal are provided to switch a resultant clock between the first clock signal and the second clock signal such that at least two cycles of the second clock signal elapse before the second clock signal is switched on after the first clock signal is switched off.

13. The apparatus as described in claim 12, wherein the first select signal and the second select signal are provided to switch the resultant clock between the first clock signal and the second clock signal such that two cycles of the second clock signal elapse before the second clock signal is switched on after the first clock signal is switched off.

14. The apparatus as described in claim 12, wherein the first select signal and the second select signal are provided to switch the resultant clock between the first clock signal and the second clock signal such that three cycles of the second clock signal elapse before the second clock signal is switched on after the first clock signal is switched off.

15. An apparatus comprising:
a first circuit coupled to a relatively fast clock signal to provide a first select signal, the first circuit including an inverter, a synchronizer, an AND gate, and a multiplexer;
a second circuit coupled to a slower clock signal and to the first circuit to provide a second select signal, the second circuit including a inverter, a synchronizer, an AND gate, and a multiplexer, wherein the relatively fast clock signal and the slower clock signal are asynchronous to one another and the first select signal and the second select signal are provided to switch a resultant clock between the relatively fast clock signal and the slower clock signal such that at least two cycles of the slower clock signal elapse before the slower clock signal is switched on after the relatively fast clock signal is switched off.

16. The apparatus as described in claim 15, wherein the first select signal and the second select signal are provided to switch the resultant clock between the relatively fast clock signal and the slower clock signal such that two cycles of the slower clock signal elapse before the slower clock signal is switched on after the relatively fast clock signal is switched off.

17. The apparatus as described in claim 15, wherein the first select signal and the second select signal are provided to switch the resultant clock between the relatively fast clock signal and the slower clock signal such that three cycles of the slower clock signal elapse before the slower clock signal is switched on after the relatively fast clock signal is switched off.

* * * * *

UNITED STATES PATENT AND TRADEMARK OFFICE
CERTIFICATE OF CORRECTION

PATENT NO. : 6,292,038 B1
DATED : September 18, 2001
INVENTOR(S) : Stachura et al.

It is certified that error appears in the above-identified patent and that said Letters Patent is hereby corrected as shown below:

Column 4,
Line 10, delete "320", insert -- 325 --.

Signed and Sealed this

Third Day of September, 2002

Attest:

JAMES E. ROGAN
Attesting Officer
Director of the United States Patent and Trademark Office